US006246706B1

(12) United States Patent
Kafka et al.

(10) Patent No.: US 6,246,706 B1
(45) Date of Patent: Jun. 12, 2001

(54) LASER WRITING METHOD AND APPARATUS

(75) Inventors: James D. Kafka, Mountain View; Bruce Craig, Los Gatos, both of CA (US)

(73) Assignee: Spectra Physics Lasers, Inc., Mountain View, CA (US)

( * ) Notice: Subject to any disclaimer, the term of this patent is extended or adjusted under 35 U.S.C. 154(b) by 0 days.

(21) Appl. No.: 09/322,803

(22) Filed: May 27, 1999

(51) Int. Cl.[7] ....................................... H01S 3/10
(52) U.S. Cl. ................. 372/24; 372/22; 372/39; 372/13; 372/18
(58) Field of Search ................. 372/24, 39, 41, 372/69, 70, 99, 22, 13, 18, 19

(56) References Cited

U.S. PATENT DOCUMENTS

| 4,436,806 | 3/1984 | Rendulic et al. ............ 430/311 |
| 4,724,465 | 2/1988 | Davies .......................... 355/53 |
| 4,727,381 | 2/1988 | Bille et al. ................... 346/108 |
| 5,109,149 | 4/1992 | Leung ........................ 219/121.69 |
| 5,127,987 | 7/1992 | Okudaira et al. ............ 156/643 |
| 5,206,868 | 4/1993 | Deacon .......................... 372/21 |
| 5,287,373 | * 2/1994 | Rapopor et al. ............... 372/39 |
| 5,570,384 | * 10/1996 | Nishida et al. ................ 372/19 |
| 5,627,854 | 5/1997 | Knox ............................. 372/99 |
| 5,745,284 | 4/1998 | Goldberg et al. ............ 359/344 |
| 5,812,308 | 9/1998 | Kafka et al. .................. 359/346 |
| 5,834,160 | 11/1998 | Ferry et al. ................... 430/313 |
| 5,840,239 | 11/1998 | Partanen et al. .............. 264/401 |

FOREIGN PATENT DOCUMENTS

| 195 29 656 A1 | 2/1997 | (DE) ................. G03F/7/20 |
| 0 818 858 A2 | 1/1998 | (EP) ................. H01S/3/0941 |
| WO 97/45902 | 4/1997 | (WO) ................. H01S/3/10 |
| WO 98/27450 | 6/1998 | (WO) ................. G02B/26/10 |
| WO 98/33096 | 7/1998 | (WO) ................. G03F/1/08 |

* cited by examiner

*Primary Examiner*—Leon Scott, Jr.
(74) *Attorney, Agent, or Firm*—Wilson, Sonsini, Goodrich & Rosati

(57) ABSTRACT

A laser writing system includes a high reflector and an output coupler that define an oscillator cavity. A gain medium and a mode locking device are positioned in the oscillator cavity. A diode pump source produces a pump beam that is incident on the gain medium and an output beam is produced. A support holds a workpiece. Means are provided for directing the output beam across the workpiece.

63 Claims, 4 Drawing Sheets

1

LASER WRITING METHOD AND APPARATUS

CROSS REFERENCE TO RELATED APPLICATIONS

This application is related to U.S. patent application entitled "Method and Apparatus to Detect a Flaw in a Surface of an Article", identified as 09/321,499, filed concurrent herewith; and U.S. patent application entitled "Quasi-Continuous Wave Lithography Apparatus and Method", identified as 09/322,121, filed concurrent herewith, which applications are incorporated herein by reference.

BACKGROUND OF THE INVENTION

1. Field of the Invention

This invention relates to laser writing, and more particularly to a method and apparatus for laser writing using a diode pumped, mode-locked laser and/or laser/amplifier system.

2. Description of Related Art

The production of an integrated circuit normally begins with a photomask, which is a photographic negative of a layer of the circuit. The photomask for the first layer of the integrated circuit is projected onto a wafer of silicon which is coated with a photosensitive material. The latent image of the circuit pattern for the first layer is then developed, and the silicon uncovered in this process is appropriately treated to change its electrical characteristics. The steps are repeated for each circuit layer using an appropriate photomask.

Two masking techniques used are contact printing, in which the mask is in contact or in extremely close proximity to the photoresist layer, and projection printing, in which the mask is imaged onto the photoresist. Projection printing offers the advantage that the mask is out of contact with the photoresist, thereby avoiding the hazard of accidental abrasion of the photoresist coating or the mask. A disadvantage is that, generally speaking, increases in the resolution of the image lens are accompanied by reductions of the image field; that is, reductions in the mask area that can be imaged onto the wafer.

In the fabrication of semiconductor devices by photolithographic techniques, a semiconductor wafer is coated with a photoresist, and exposed to actinic light projected through a mask. Development and etching of the selectively exposed photoresist defines a pattern on the wafer surface which may be used for establishing diffusion areas, conductor patterns, and the like. Modern integrated circuit fabrication requires several printing steps to be performed successively, with each mask exposure being in precisely controlled registration with previously formed patterns.

Contact printing was later supplanted by one-to-one projection printing of the circuit onto the photoresist material. Reticles have also been used. These reticles are photomasks of one layer of an integrated circuit pattern enlarged ten times and produced on a glass plate.

Photomasks are produced by photographic reduction of computer generated artwork with the use of a raster-scanned beam.

SUMMARY OF THE INVENTION

Accordingly, an object of the invention is to provide a method and apparatus for laser writing.

Another object of the invention is to provide a method and apparatus for laser writing using a diode pumped laser or laser/amplifier system.

Yet another object of the invention is to provide a method and apparatus for laser writing using a diode pumped, mode locked, laser or laser/amplifier system.

These and other objects of the invention are achieved in a laser writing system including a high reflector and an output coupler that difine an oscillator cavity. A gain medium and a mode locking device are positioned in the oscillator cavity. A diode pump source produces a pump beam that is incident on the gain medium and an output beam is produced. A support holds a workpiece. Means are provided for directing the output beam across the workpiece.

In another embodiment, the laser writing system includes a high reflector and an output coupler that define an oscillator cavity. A gain medium and a mode locking device are positioned in the oscillator cavity. A first amplifier is coupled to the oscillator cavity. A diode pump source produces a pump beam that is incident on the gain medium and an output beam is produced and amplified by the first amplifier. A support holds a workpiece. Means are provided for directing the amplified output beam across the workpiece.

In another embodiment, a method of laser writing provides a diode pumped laser system including an oscillator cavity, a gain medium and a mode locking device positioned in the oscillator cavity. An output beam is produced from the laser system. The output beam is directed to a workpiece surface.

DETAILED DESCRIPTION

Figure 1:
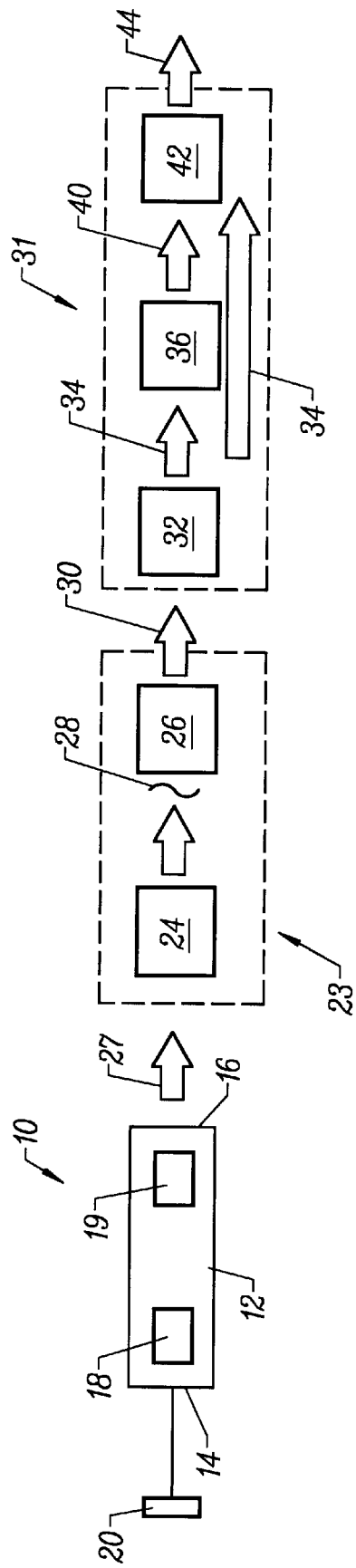
FIG. 1 is a block diagram of a laser, laser/amplifier system useful with the present invention.

The present invention provides a laser writing system that includes a laser system. The laser system includes an oscillator system or an oscillator/amplifier system. The oscillator/amplifier system is similar to the oscillator system but includes one or more amplifiers. The oscillator and oscillator/amplifier systems can be coupled with second, third, fourth and fifth harmonic generators. A second harmonic generator can be used alone with the oscillator and oscillator/amplifier systems and in various combinations with third, fourth and fifth harmonic generators. Additionally, the harmonic generators can be coupled with an OPO. The OPO can be pumped by a fundamental beam from an oscillator or from the harmonic generators. An output of the OPO can be mixed with the harmonic generators to generate a variable wavelength source.

In one embodiment, the oscillator system includes an Nd:YVO$_4$ gain media and is mode locked by a multiple quantum well absorber. In a specific embodiment of this oscillator system, the oscillator is pumped by a single fiber-coupled diode bar that provides 13 watts of pump power incident on the Nd:YVO$_4$ gain media, and typically produces 5–6 watts of 5–15 picosecond pulses at 80 MHz repetition rate.

In another embodiment, an oscillator/amplifier system includes an Nd:YVO$_4$ gain media mode locked by a multiple quantum well absorber, a double pass amplifier and two single pass amplifiers. Each of the amplifiers has an Nd:YVO$_4$ gain media and is pumped by two fiber-coupled diode pump sources. This oscillator/amplifier system produces 25–30 watts of 5–15 picosecond pulses at 80 MHz repetition rate.

The oscillator and oscillator/amplifier systems can be mode locked with a multiple quantum well saturable absorber, a non-linear mirror mode locking method, a polarization coupled mode locking method or other mode locking techniques, including but not limited to use of an AO modulator. An example of a quantum well saturable absorber is disclosed in U.S. Pat. No. 5,627,854, incorporated herein by reference. An example of a non-linear mirror mode locking method is disclosed in U.S. Pat. No. 4,914,658, incorporated herein by reference. An example of a polarization coupled mode locking method is disclosed in Ser. No. 09/062,057, filed Apr. 17, 1998, assigned to the same assignee as this application and incorporated herein by reference. In order to producer shorter pulses and a single output beam the gain media is positioned adjacent to a fold mirror as described in U.S. Pat. No. 5,812,308, incorporated herein by reference.

A high power oscillator system with the performance of an oscillator/amplifier system is achieved by using multiple fiber-coupled diodes and either a non-linear mirror mode locking technique or a polarization coupled mode locking method. This high power oscillator system produces 10–20 watts of output power with 4–10 picosecond pulses at a repetition rate of 80–120 MHz. High repetition rates are desirable for applications where the laser system is used as a quasi-CW source. For some applications, 80 MHz repetition rate is sufficiency high to be consider to be quasi-CW. This repetition rate is achieved with an oscillator cavity length of 1.8 meters. When the cavity length is shorted to 0.4 meters the repetition rate increases to 350 MHz.

Referring now to FIG. 1, one embodiment of an oscillator system 10 has a resonator cavity 12 defined by a high reflector 14 and an output coupler 16. A gain media 18 is positioned in resonator cavity 12. Suitable gain media 18 include but are not limited to, Nd:YVO$_4$, Nd:YAG, Nd:YLF, Nd:Glass, Ti:sapphire, Cr:YAG, Cr:Forsterite, Yb:YAG, Yb:glass and the like. A preferred gain media 18 is Nd:YVO$_4$. A mode locking device 19 is positioned in oscillator cavity 12. In the embodiment, oscillator system 10 is mode locked and pumped by a fiber-coupled bar 20 that produces 13 watts of power. Oscillator cavity 12 can produce 1 to 6 watts of power nominally at a 80 MHz repetition rate with pulse widths of 5 to 15 picoseconds.

Optionally included is one or more amplifiers, generally denoted as 23. An output beam 22 from resonator cavity 12 can be amplified by a first amplifier 24. A second amplifier 26 can be included. Additional amplifiers may also be included to increase power. Typically, amplifiers 24 and 26 have the same gain media used in resonator cavity 12. Nd:YVO$_4$ is a suitable gain media material because it provides high gain in an amplifier. The higher gain of Nd:YVO$_4$ provides a simplified amplifier design requiring fewer passes through the gain media. Amplifiers 24 and 26 produce output beams 28 and 30 respectively. Amplifiers 24 and 26 can be single pass, double pass and four pass. A four pass amplifier is disclosed in U.S. Pat. No. 5,812,308, assigned to the same assignee as this application and incorporated herein by reference. Oscillator/amplifier system 10 using an oscillator, a double pass amplifier and two single pass amplifiers can provide 30 watts of average power.

Output beams 22, 28 or 30 can be incident on a harmonic generator generally denoted as 31 and can include a second harmonic generator 32. An output 34 from second harmonic generator 32 can be incident on a third harmonic generator 36 to produce an output beam 40. Output 34 can be incident on a fourth harmonic generator 42 to produce an output beam 44. It will be appreciated that oscillator system 10 can include various combinations of harmonic generators 32, 36, 42 as well as a fifth harmonic generator or an OPO. Second harmonic generator 32 can use non-critically phase matched LBO, third harmonic generator 36 can employ type II LBO and fourth harmonic generator 42 can use type IBBO.

In a specific embodiment, oscillator system 10 includes oscillator cavity 12 with harmonic generation. Output beam 22 is incident on second harmonic generator 32. In this specific embodiment, oscillator system 10 may also include third and fourth harmonic generators 36 and 42. The output power of this oscillator system 10 is 5 watts at 1064 nm. A harmonic generation system produces 2 watts at 532 nm or 1 watt at 355 nm or 200 milliwatts at 266 nm.

In another specific embodiment, Nd:YVO$_4$ is the gain media of oscillator/amplifier system 10, and 29 watts of 7 picosecond pulses at 1064 nm is produced. The harmonic generation system can generate 22 watts at 532 nm or 11 watts at 355 nm or 4.7 watts at 266 nm.

In another specific embodiment, oscillator/amplifier system 10 includes oscillator cavity 12, a four pass amplifier 24 and second harmonic generator 32 to produce 2 watts at 532 nm. This oscillator/amplifier system can pump an OPO that utilizes non-critically phase matched LBO as described in Kafka, et al., J. Opt. Soc. Am. B 12, 2147–2157 (1995) incorporated herein by reference.

In another specific embodiment, oscillator/amplifier system 10 includes oscillator cavity 12, a double pass amplifier 24 and three single pass amplifiers 26 that produces 42 watts of 7 picosecond pulses at 1064 nm. This oscillator/amplifier system can pump an OPO using non-critically phase-matched KTA and produce an output beam at 1535 nm. The output beam at 1535 nm can be mixed with a 1064 nm beam to provide 11.6 watts at 629 nm, as described in Nebel, et al., in *Conference on Lasers and Electro-Optics*, Vol. 6 of 1998 OSA Technical Digest Series (Optical Society of America, Washington, D.C., 1998) postdeadline paper CPD3.

40 watts fiber-coupled bars, commercially available from Opto-Power, Tucson, Ariz. can be used to increase the output power of oscillator or oscillator/amplifier systems 10. The use of an Nd:YVO$_4$ gain media 18 with a doping level of less than 0.5% can also be used to increase the output power of oscillator or oscillator/amplifier systems 10. The combination of the 40 watt fiber-coupled bars with the low doped Nd:YVO$_4$ gain media greatly increases the output power of oscillator and oscillator/amplifier systems 10. Use of low doped Nd:YVO$_4$ gain media 18 can also reduce the sensitivity of oscillator cavity 12 to misalignment as well as improve the output beam quality from an amplifier 24 or 26. The use of low doped Nd:YVO$_4$ gain media, a longer Nd:YVO$_4$ gain media as well as a larger pump volume in Nd:YVO$_4$ gain media is disclosed in commonly owned application Ser. No. 09/199,031, filed Nov. 24, 1998, incorporated herein by reference.

Figure 2:
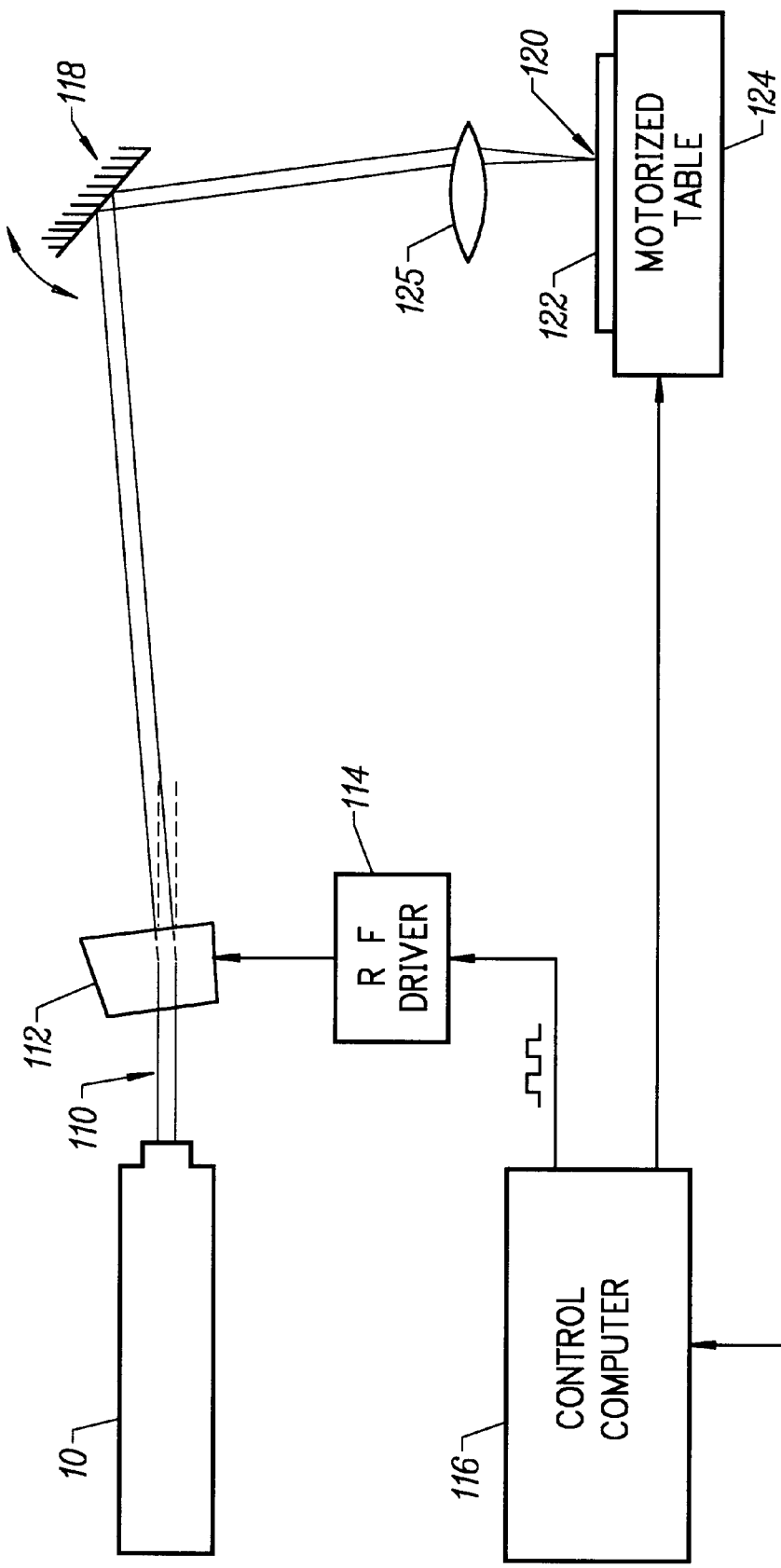
FIG. 2 is a block diagram of a laser writing system using the laser, laser/amplifier system of FIG. 1.

Referring now to FIG. 2, output beams 22, 28, 30, 34, 40 or 44 (hereafter collectively referred to as output beam 110) can be passed through an acousto-optic modulator 112, which may be controlled by driver 114, including but not limited to a radio frequency (RF) driver 114. Hereafter, oscillator system and/or oscillator/amplifier system 10, shall collectively be referred to as oscillator 10. A controller 116 is coupled to driver 114. Controller 116 may include a computer work station that permits the creation and design of different integrated circuits. Output beam 110 is directed to a scanning mirror 118, which directs the beam into a spot 120 on a photoresist coated integrated circuit wafer 122. In one embodiment, integrated circuit wafer 122 is mounted on a motorized X-Y axis movable table 124 that is also controlled by controller 116 and output beam 110 is passed through a lens 125 including but not limited to a microscope objective. Focussed laser spot 120 can be on the order of 0.7 microns. Both the motorized X-Y table 124 and output beam 110 are under computer control to expose the photoresist selectively according to information stored in controller 116. An interconnect pattern of an integrated circuit is transferred from data stored in controller 116 directly to the photoresist layer of integrated circuit wafer 122. Scanning mirror 118 improves the throughput of the system by enabling output beam 110 and focussed spot 120 to be moved rapidly along both the X and Y axis. Table 124 has a certain amount of inertia and this restricts the ability of table 124 to be moved rapidly along both the X and Y axis and increases the overall speed of production by orders of magnitude. Scanning mirror 118 is used to deflect output beam 110 in order to produce a selected size spot on the Y axis scan line. In one embodiment, scanning mirror 118 is motor driven and moved mechanically.

Output beam 110 can be switched on and off by acousto-optic modulator 112. The modulated output beam is then deflected by scanning mirror 118. This same type of scanning function can be provided by a resonant scanner commercially available from General Scanning of Watertown, Mass.

Figure 3:
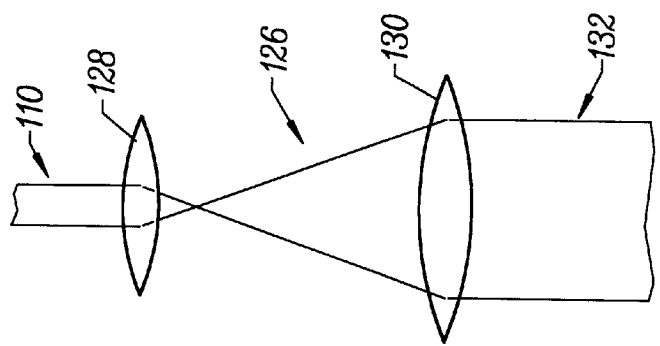
FIG. 3 is a block diagram illustrating the use of a beam expander with the output beam generated from the laser, laser/amplifier system of FIG. 1.
Figure 4:
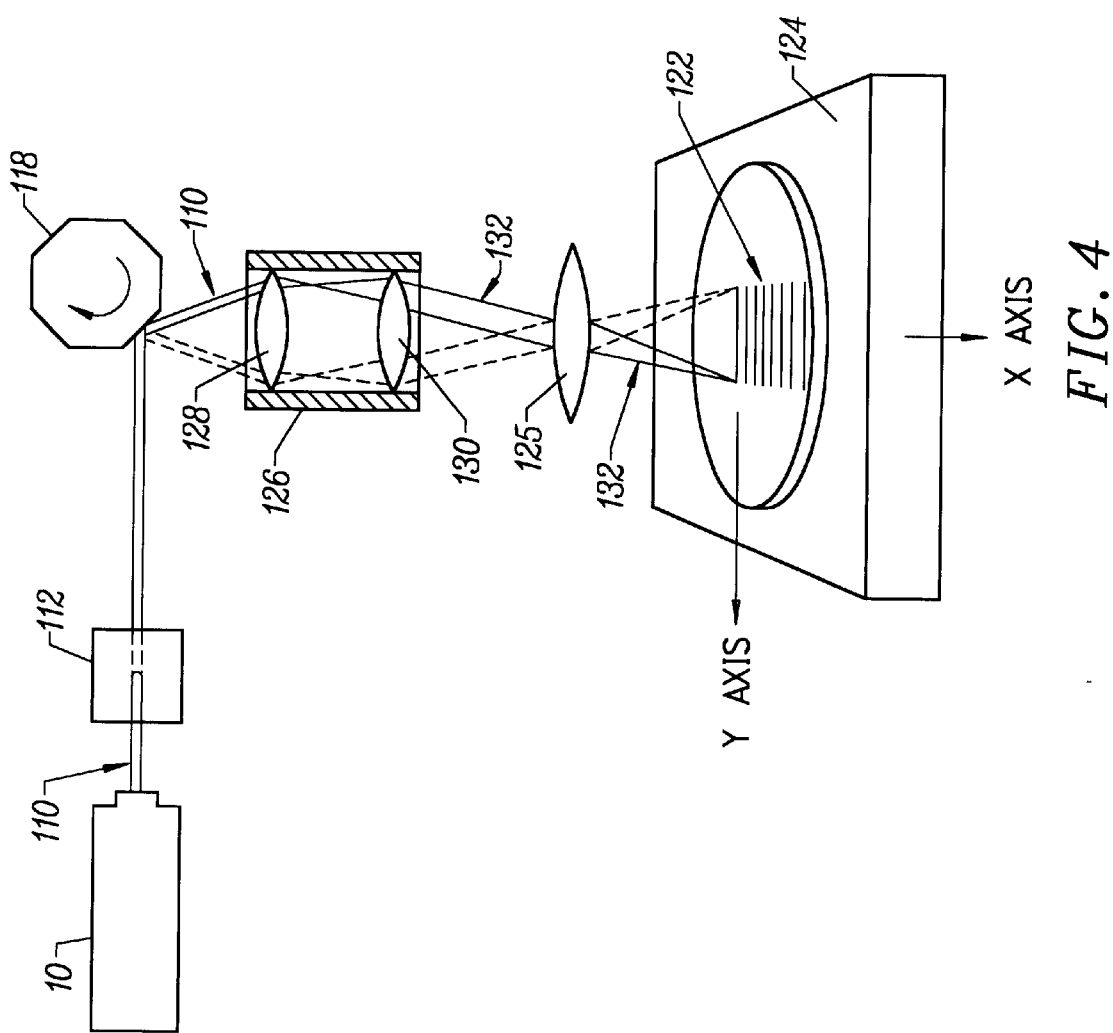
FIG. 4 is a block diagram of a laser writing system with the beam expander of FIG. 3.

Referring now to FIGS. 3 and 4, the deflected output beam 110 then enters a beam expander 126. In one embodiment, beam expander 126 includes at least two lenses 128 and 130. Output beam 110 becomes an expanded beam 132. Expanded beam 132 can be focussed with lens 125 according to the size, shape, degree of pattern accuracy and level of actinic light exposure.

Figure 5:
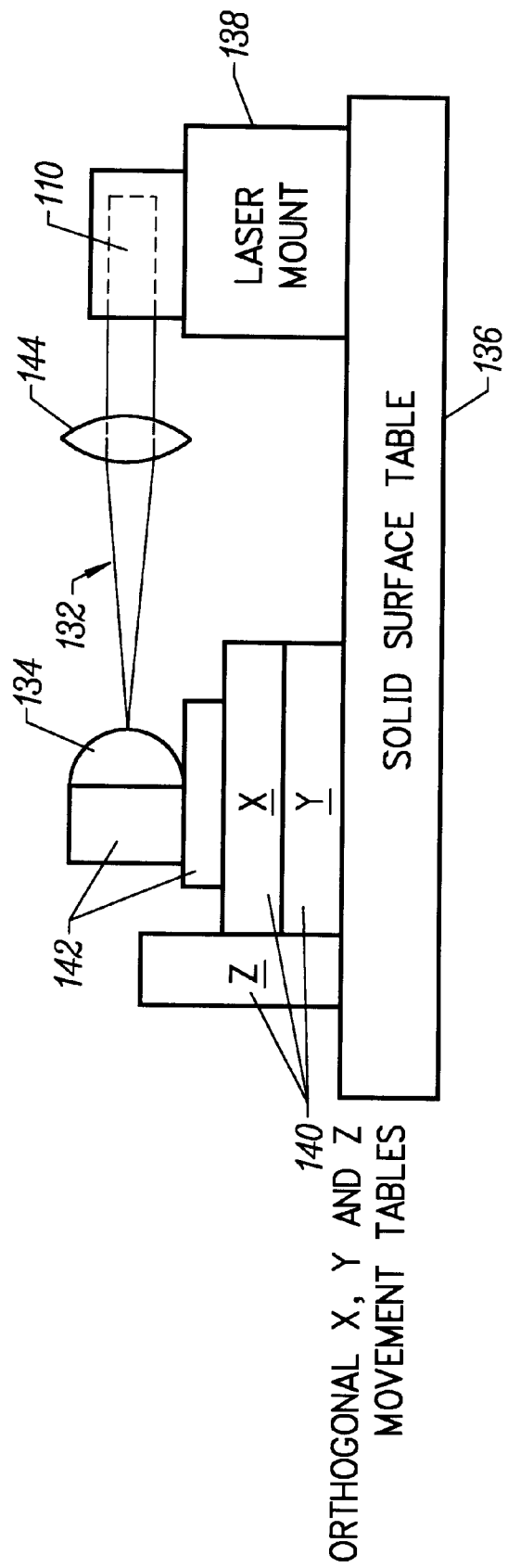
FIG. 5 illustrates an embodiment of the laser writing system of the present invention using orthogonal movement tables.

In another embodiment illustrated in FIG. 5, expanded beam 132 is directed at a photoresist-coated workpiece 134 to effect its exposure. Relative motion between workpiece 134 and expanded output beam 132 is controlled to produce a desired pattern. The relative motion can be produced in a number of ways including but not limited to, (i) movement of oscillator 10, (ii) use of a movable light reflector or refractor or (iii) movement of workpiece 134.

In the embodiment illustrated in FIG. 5, a solid surface table 136 carries a mount 138 for oscillator 10. Output beam 110 is directed towards workpiece 134 that is supported on table 136. Three movement tables 140 can be provided for independent translational movement along orthogonal X, Y and Z axes. Two movement tables 142 may be provided for independent rotational movement about vertical and horizontal axes. A fixed lens 144 is used to focus or partially focus output beam 110 into an image on workpiece 134, which is shown for purposes of illustration only, as spherical.

Exposure of the photoresist on workpiece 134 is achieved by appropriate computer controlled movement of workpiece 134 through movement of tables 140 and 142 to effect the desired pattern shape, resolution and level of exposure. A controller (not shown) governs the distance of workpiece 134 from lens 144, the angle of incidence of output beam 110 on workpiece 134. output beam 110 image size and intensity as well as its surface velocity. A beam image on workpiece 134 can be formed in front of or behind a focal point of lens 144, depending on the size of the spot desired. In some applications lens 144 may be removed entirely. Compound lenses and systems of lenses of any geometry may be used for focussing or beam shaping. When required, attenuating filters and irises may also be used in various combinations. The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A laser writing system, comprising:
   a high reflector and an output coupler defining an oscillator cavity that produces an output beam;
   a gain medium with a doping level of less than 0.5% positioned in the oscillator cavity;
   a mode locking device positioned in the oscillator cavity;
   a diode pump source producing a pump beam incident on the gain medium;
   a support for holding a workpiece; and
   means for directing and writing the output beam across the workpiece.

2. The system of claim 1, wherein the means for directing the output beam includes a scanner.

3. The system of claim 1, wherein the means for directing the output beam includes a rotatable reflector.

4. The system of claim 1, wherein the means for directing the output beam includes means for moving the support.

5. The system of claim 1, wherein the gain medium is Nd:YVO$_4$, Nd:YAG, Nd:YLF, Nd:Glass, Ti:sapphire, Cr:YAG, Cr:Forsterite, Yb:YAG and Yb:glass.

6. The system of claim 1, wherein the gain medium is Nd:YVO$_4$.

7. The system of claim 1, wherein the diode pump source is fiber coupled.

8. The system of claim 1, wherein the mode locking device is a multiple quantum well saturable absorber.

9. The system of claim 1, wherein the mode locking device is a non-linear mirror mode locker.

10. The system of claim 1, wherein the mode locking device is a polarization coupled mode locker.

11. The system of claim 1, wherein the mode locking device is an acousto-optic modulator.

12. The system of claim 1, wherein the output beam has a power of 10 watts or greater.

13. The system of claim 12, wherein the output beam is pulsed at 4–10 picoseconds.

14. The system of claim 12, wherein the output beam has a repetition rate of 80–120 MHz.

15. The system of claim 12, wherein the output beam is pulsed at 4–10 picoseconds.

16. The system of claim 15, wherein the output beam has a repetition rate of 80–120 MHz.

17. The system of claim 1, further comprising:
    a second harmonic generator coupled to the oscillator cavity.

18. The system of claim 17, further comprising:
    a third harmonic generator coupled to second harmonic generator.

19. The system of claim 18, wherein the third harmonic generator is made of type II LBO.

20. The system of claim 18, wherein the third harmonic generator is made of type II LBO.

21. The system of claim 17, further comprising:
a fourth harmonic generator coupled to the second harmonic generator.

22. The system of claim 21, wherein the fourth harmonic generator is made of type I BBO.

23. The system of claim 17, further comprising:
a fourth harmonic generator coupled to the second harmonic generator.

24. The system of claim 23, wherein the fourth harmonic generator is made of type I BBO.

25. The system of claim 17, further comprising:
a fourth harmonic generator coupled to the second harmonic generator.

26. The system of claim 1, wherein the second harmonic generator is made of LBO.

27. A laser writing system, comprising:
a high reflector and an output coupler defining an oscillator cavity that produces an output beam;
a gain medium positioned in the oscillator cavity;
a mode locking device positioned in the oscillator cavity;
a fiber coupled diode pump source producing a pump beam incident on the gain medium;
a first amplifier coupled to the oscillator cavity;
a support for holding a workpiece; and
means for directing and writing the output beam across the workpiece.

28. The system of claim 27, wherein the means for directing the output beam includes a scanner.

29. The system of claim 27, wherein the means for directing the output beam includes a rotatable reflector.

30. The system of claim 27, wherein the means for directing the output beam includes means for moving the support.

31. The system of claim 27, wherein the gain medium is Nd:YVO$_4$, Nd:YAG, Nd:YLF, Nd:Glass, Ti:sapphire, Cr:YAG, Cr:Forsterite, Yb:YAG and Yb:glass.

32. The system of claim 27, wherein the gain medium is Nd:YVO$_4$.

33. The system of claim 32, wherein the Nd:YVO$_4$ gain medium has a doping level of less than 0.5%.

34. The system of claim 27, wherein the mode locking device is a multiple quantum well saturable absorber.

35. The system of claim 27, wherein the mode locking device is a non-linear mirror mode locker.

36. The system of claim 27, wherein the mode locking device is a polarization coupled mode locker.

37. The system of claim 27, wherein the mode locking device is an accost-optic modulator.

38. The system of claim 27, wherein the output beam has a power of 10 watts or greater.

39. The system of claim 27, further comprising:
a second harmonic generator coupled to the first amplifier.

40. The system of claim 39, further comprising:
a third harmonic generator coupled to second harmonic generator.

41. The system of claim 27, wherein the second harmonic generator is made of LBO.

42. The system of claim 27, further comprising:
a second amplifier coupled to the first amplifier.

43. The system of claim 27, further comprising:
a second harmonic generator coupled to the first amplifier.

44. The system of claim 43, further comprising:
a third harmonic generator coupled to second harmonic generator.

45. A method of laser writing, comprising:
providing a diode pumped laser system including an oscillator cavity, a gain medium with a doping level of less than 0.5% and a mode locking device positioned in the oscillator cavity;
producing an output beam from the laser system;
directing and writing the output beam at a workpiece surface.

46. The method of claim 45, wherein the output beam is scanned across the workpiece surface.

47. The method of claim 46, further comprising:
exposing a selected area of the workpiece surface to the output beam.

48. The method of claim 46, further comprising:
passing the output beam through a beam expander.

49. The method of claim 46, further comprising:
focussing the output beam onto the workpiece surface.

50. The method of claim 46, wherein the workpiece surface is a photoresist coated integrated circuit wafer.

51. The method of claim 45, wherein the gain medium is Nd:YVO$_4$.

52. The method of claim 45, wherein the laser is a fiber coupled diode pumped laser.

53. The method of claim 45, wherein the mode locking device is a multiple quantum well saturable absorber.

54. The method of claim 45, wherein the mode locking device is a non-linear mirror mode locker.

55. The method of claim 45, wherein the mode locking device is a polarization coupled mode locker.

56. The method of claim 45, wherein the mode locking device is an accost-optic modulator.

57. The method of claim 45, wherein the output beam has a power of 10 watts or greater.

58. The method of claim 51, wherein the output beam is pulsed at 4–10 picoseconds.

59. The method of claim 58, wherein the output beam has a repetition rate of 80–120 MHz.

60. The method of claim 45, wherein the laser system further includes a harmonic generator device.

61. The method of claim 60, wherein the laser/amplifier system includes a harmonic generator device.

62. The method of claim 60, wherein the laser/amplifier system includes a second amplifier.

63. The method of claim 45, wherein the laser system is a laser/amplifier system that includes a first amplifier.

* * * * *